United States Patent
Yang et al.

(10) Patent No.: US 10,658,609 B2
(45) Date of Patent: May 19, 2020

(54) ARRAY SUBSTRATE AND DISPLAY APPARATUS

(71) Applicant: BOE Technology Group Co., Ltd., Beijing (CN)

(72) Inventors: Chengchung Yang, Beijing (CN); Tingting Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 54 days.

(21) Appl. No.: 16/117,663

(22) Filed: Aug. 30, 2018

(65) Prior Publication Data
US 2019/0103578 A1 Apr. 4, 2019

(30) Foreign Application Priority Data
Sep. 29, 2017 (CN) .......................... 2017 1 0912413

(51) Int. Cl.
*H01L 51/52* (2006.01)
*H01L 27/32* (2006.01)
*H01L 21/8238* (2006.01)

(52) U.S. Cl.
CPC ...... *H01L 51/5203* (2013.01); *H01L 21/8238* (2013.01); *H01L 27/326* (2013.01); *H01L 27/3246* (2013.01); *H01L 27/3274* (2013.01); *H01L 27/3276* (2013.01); *H01L 27/3218* (2013.01); *H01L 27/3265* (2013.01)

(58) Field of Classification Search
CPC ............. H01L 51/5203; H01L 21/8238; H01L 27/3274; H01L 27/3276; H01L 27/326; H01L 27/3246; H01L 27/3265; H01L 27/3218
See application file for complete search history.

(56) References Cited

U.S. PATENT DOCUMENTS

| | | | | |
|---|---|---|---|---|
| 8,305,539 B2* | 11/2012 | Su | ..................... | G02F 1/134336 349/144 |
| 9,116,407 B2* | 8/2015 | Li | ...................... | G02F 1/134336 |
| 2013/0141411 A1* | 6/2013 | Tanaka | ................. | G09G 3/3696 345/211 |
| 2013/0141657 A1* | 6/2013 | Chen | ................. | G02F 1/133707 349/43 |
| 2016/0301027 A1* | 10/2016 | Wang | .................... | H01L 51/525 |
| 2018/0321788 A1* | 11/2018 | Kimura | ................. | G02F 1/1368 |
| 2019/0097159 A1* | 3/2019 | Ye | ....................... | H01L 51/5278 |

* cited by examiner

*Primary Examiner* — Savitri Mulpuri
(74) *Attorney, Agent, or Firm* — Westman, Champlin & Koehler, P.A.

(57) ABSTRACT

Embodiments of the present disclosure provide an array substrate and a display apparatus having the array substrate. The array substrate includes: a plurality of pixel units which are arranged in an array and, which include a plurality of pixel electrodes arranged at intervals, respectively; a conductive layer disposed above or below two adjacent ones of the plurality of pixel electrodes, and configured such that when a preset electric potential is applied to the conductive layer, a first equivalent capacitance is formed between the conductive layer and a first one of the two adjacent pixel electrodes and a second equivalent capacitance is formed between the conductive layer and a second one of the two adjacent pixel electrodes.

18 Claims, 4 Drawing Sheets

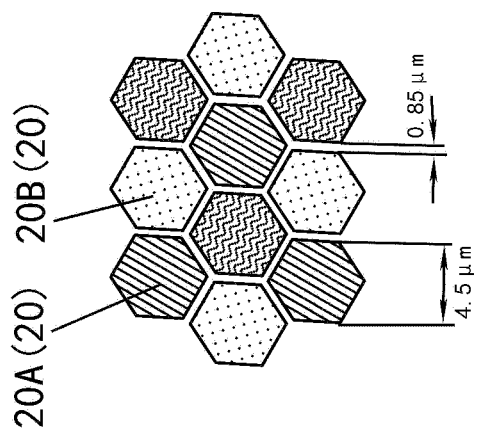
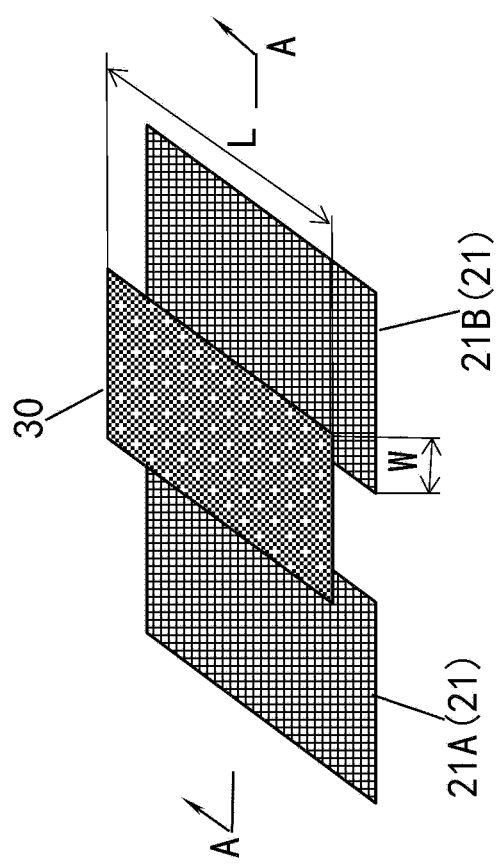
FIG. 3
FIG. 2

ARRAY SUBSTRATE AND DISPLAY APPARATUS

CROSS-REFERENCE TO RELATED APPLICATION

This application claims priority to Chinese Patent Application No. 201710912413.0, filed on Sep. 29, 2017, entitled "ARRAY SUBSTRATE AND DISPLAY APPARATUS", which is incorporated herein by reference.

BACKGROUND

1. Technical Field

Embodiments of the present disclosure relate to an array substrate and a display apparatus.

2. Description of the Related Art

Crosstalk of control signals will occur between two adjacent pixel electrodes due to a capacitance coupling effect in a display, especially in an ultra-high PPI (Pixels Per Inch) OLED (Organic Light-Emitting Diode) display.

SUMMARY

Embodiments of the present disclosure provide an array substrate comprising: a plurality of pixel units which are arranged in an array and, which comprise a plurality of pixel electrodes arranged at intervals, respectively; a conductive layer disposed above or below two adjacent ones of the plurality of pixel electrodes, and configured such that when a preset electric potential is applied to the conductive layer, a first equivalent capacitance is formed between the conductive layer and a first one of the two adjacent pixel electrodes and a second equivalent capacitance is formed between the conductive layer and a second one of the two adjacent pixel electrodes.

According to embodiments of the present disclosure, the first equivalent capacitance, the second equivalent capacitance, and a third equivalent capacitance formed between the two adjacent pixel electrodes are set to be the same.

According to embodiments of the present disclosure, an orthogonal projection of each of the two adjacent pixel electrodes on a plane in which the plurality of pixel electrodes are located coincides partially with an orthogonal projection of the conductive layer on the plane.

According to embodiments of the present disclosure, the conductive layer is disposed above or below a pixel electrode separating region between the two adjacent pixel electrodes.

According to embodiments of the present disclosure, each of the plurality of pixel electrodes comprises two opposite edge portions, and a middle portion between the two edge portions; and the array substrate further comprises: a base substrate on which the plurality of pixel electrodes are disposed; and a pixel defining layer comprises a retaining wall, wherein the retaining wall is located both on an exposed portion, in a pixel electrode separating region between the two adjacent pixel electrodes, of the base substrate, and on the edge portions, close to the exposed portion, of the two adjacent pixel electrodes, and the conductive layer is disposed on the retaining wall.

According to embodiments of the present disclosure, the array substrate further comprises: an organic light-emitting layer covering the middle portions of the pixel electrodes.

According to embodiments of the present disclosure, the array substrate further comprises: an organic light-emitting layer covering both the middle portions of the pixel electrodes and the conductive layer.

According to embodiments of the present disclosure, the array substrate further comprises: a common electrode covering the organic light-emitting layer.

According to embodiments of the present disclosure, the base substrate comprises: a silicon CMOS chip; and a via hole layer disposed on the silicon CMOS chip and having a via hole, wherein the silicon CMOS chip is connected to the plurality of pixel electrodes through the via hole of the via hole layer.

According to embodiments of the present disclosure, an overlap between the conductive layer and the first one of the two adjacent pixel electrodes and an overlap between the conductive layer and the second one of the two adjacent pixel electrodes have a same area, and a distance between the conductive layer and the first one of the two adjacent pixel electrodes and a distance between the conductive layer and the second one of the two adjacent pixel electrodes are the same.

According to embodiments of the present disclosure, an orthogonal projection of each of the plurality of pixel electrodes on a plane in which the plurality of pixel electrodes are located has a rectangular shape, and an orthogonal projection of the conductive layer on the plane has a rectangular shape.

According to embodiments of the present disclosure, the first equivalent capacitance is calculated by a formula: $C_A = \varepsilon * W_A * L_A / T_A$, where $C_A$ is the first equivalent capacitance, $\varepsilon$ is a conductivity of a dielectric between the conductive layer and the first pixel electrode, between the conductive layer and the second pixel electrode, and between the first pixel electrode and the second pixel electrode, $W_A$ is a width of an overlap between the conductive layer and the first pixel electrode, $L_A$ is a length of the overlap between the conductive layer and the first pixel electrode, and $T_A$ is a distance between the conductive layer and the first pixel electrode; the second equivalent capacitance is calculated by a formula: $C_B = \varepsilon * W_B * L_B / T_B$, where $C_B$ is the second equivalent capacitance, $W_B$ is a width of an overlap between the conductive layer and the second pixel electrode, $L_B$ is a length of the overlap between the conductive layer and the second pixel electrode, and $T_B$ is a distance between the conductive layer and the second pixel electrode; and the third equivalent capacitance is calculated by a formula: $C = \varepsilon * T_O * L / D$, where $C$ is the third equivalent capacitance, $T_O$ is a thickness of each pixel electrode, $D$ is a distance between the two adjacent pixel electrodes, and $L$ is a length of each of the first pixel electrode and the second pixel electrode.

According to embodiments of the present disclosure, an overlap between the conductive layer and the first one of the two adjacent pixel electrodes and an overlap between the conductive layer and the second one of the two adjacent pixel electrodes have a same length and a same width, and a distance between the conductive layer and the first one of the two adjacent pixel electrodes and a distance between the conductive layer and the second one of the two adjacent pixel electrodes are the same.

According to embodiments of the present disclosure, the plurality of pixel electrodes and the conductive layer have a same length.

According to embodiments of the present disclosure, the conductive layer is made of a conductive material.

According to embodiments of the present disclosure, the conductive material comprises Mo, Ti or Cu.

According to embodiments of the present disclosure, the array substrate further comprises: an inorganic film disposed between the conductive layer and the plurality of pixel electrodes to insulate the conductive layer from the plurality of pixel electrodes.

According to embodiments of the present disclosure, the inorganic film is made of silicon oxide or silicon nitride.

According to embodiments of the present disclosure, the array substrate further comprises: an organic film disposed between the conductive layer and the plurality of pixel electrodes to insulate the conductive layer from the plurality of pixel electrodes.

Embodiments of the present disclosure further provide a display apparatus comprising the abovementioned array substrate.

BRIEF DESCRIPTION OF THE DRAWINGS

FIG. 2 is a schematic diagram showing pixel electrodes and a conductive layer of the array substrate according to the embodiment of the present disclosure;

FIG. 3 is a schematic diagram showing pixels according to an embodiment of the present disclosure;

DETAILED DESCRIPTION OF THE EMBODIMENTS

In order that the objects, technical solutions and advantages of the present disclosure are more apparent and more readily appreciated, the present disclosure will be further described in detail in conjunction with embodiments with reference to the accompanying drawings as below.

Figure 1:
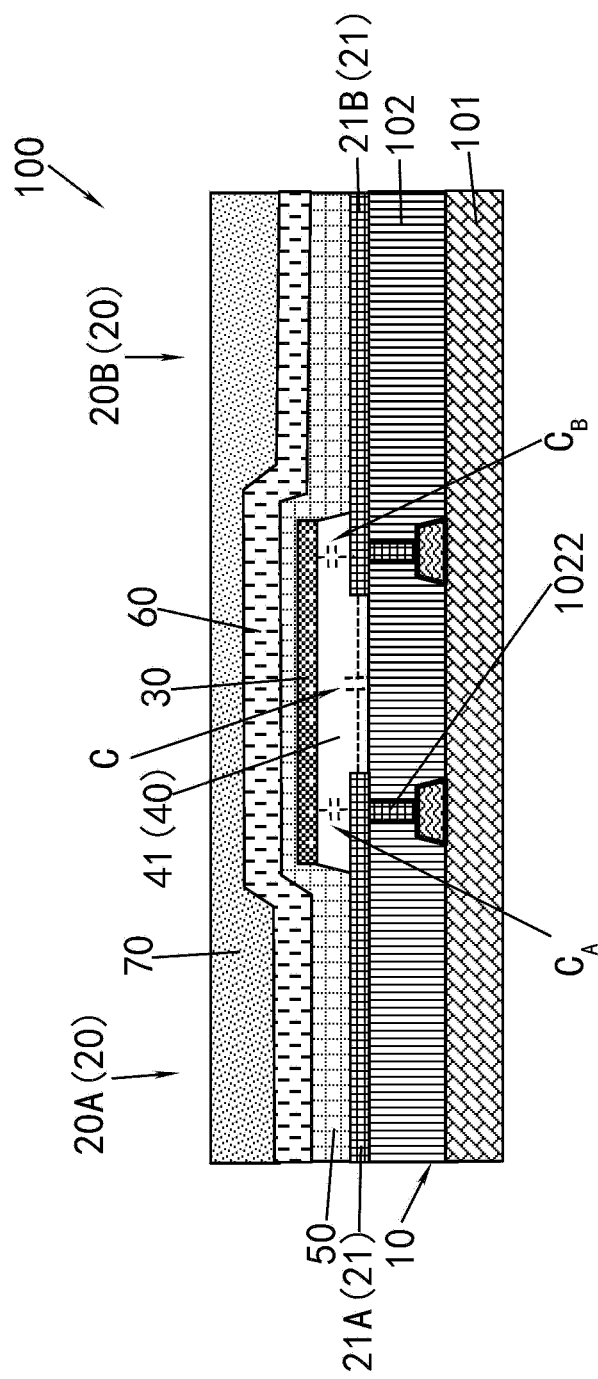
FIG. 1 is a schematic diagram showing a structure of an array substrate according to an embodiment of the present disclosure.

Referring to FIG. 1 and FIG. 2, embodiments of the present disclosure provide an array substrate 100. The array substrate 100 includes: a plurality of pixel units 20 which are arranged in an array, and which include a plurality of pixel electrodes 21 arranged at intervals, respectively; a conductive layer 30 disposed above or below two adjacent ones 21A and 21B of the plurality of pixel electrodes 21, and configured such that when a preset electric potential is applied to the conductive layer 30, a first equivalent capacitance $C_A$ is formed between the conductive layer 30 and a first one 21A of the two adjacent pixel electrodes 21A and 21B and a second equivalent capacitance $C_B$ is formed between the conductive layer 30 and a second one 21B of the two adjacent pixel electrodes 21A and 21B. For example, the conductive layer 30 is disposed above or below a pixel electrode separating region between the two adjacent pixel electrodes 21A and 21B of the plurality of pixel electrodes 21. The conductive layer 30 may be made of a low-reflectivity conductive material. For example, the low-reflectivity conductive material includes Mo, Ti or Cu.

Referring to FIG. 1 and FIG. 2, according to embodiments of the present disclosure, the first equivalent capacitance $C_A$, the second equivalent capacitance $C_B$, and a third equivalent capacitance C formed between the two adjacent pixel electrodes 21A and 21B are set to be the same.

Referring to FIG. 1 and FIG. 2, according to embodiments of the present disclosure, an orthogonal projection of each of the two adjacent pixel electrodes 21A and 21B of the plurality of pixel electrodes 21 on a plane in which the plurality of pixel electrodes 21 are located coincides partially with an orthogonal projection of the conductive layer 30 on the plane.

Referring to FIG. 1 and FIG. 2, according to embodiments of the present disclosure, each of the plurality of pixel electrodes 21 includes two opposite edge portions, and a middle portion between the two edge portions; and the array substrate 100 further includes: a base substrate 10 on which the plurality of pixel electrodes 21 are disposed; and a pixel defining layer 40 includes a retaining wall 41. The retaining wall 41 is located both on an exposed portion, in a pixel electrode separating region between the two adjacent pixel electrodes 21A and 21B, of the base substrate 10, and on the edge portions, close to the exposed portion, of the two adjacent pixel electrodes 21A and 21B. The conductive layer 30 is disposed on the retaining wall 41. According to an embodiment of the present disclosure, the array substrate 100 further includes an inorganic film disposed between the conductive layer 30 and the plurality of pixel electrodes 21 to insulate the conductive layer 30 from the plurality of pixel electrodes 21, and serving as the retaining wall 41. The inorganic film may be made of silicon oxide or silicon nitride. According to another embodiment of the present disclosure, the array substrate 100 further includes an organic film disposed between the conductive layer 30 and the plurality of pixel electrodes 21 to insulate the conductive layer 30 from the plurality of pixel electrodes 21, and serving as the retaining wall 41.

Referring to FIG. 1, according to an embodiment of the present disclosure, the array substrate 100 further includes: an organic light-emitting layer 50 covering the middle portions of the pixel electrodes 21. Referring to FIG. 1, according to another embodiment of the present disclosure, the organic light-emitting layer 50 covers the middle portions of the pixel electrodes 21 and the conductive layer 30.

Referring to FIG. 1, according to embodiments of the present disclosure, the array substrate 100 further includes: a common electrode 60 covering the organic light-emitting layer 50. The array substrate 100 may further include a packaging layer 70.

Referring to FIG. 1, according to embodiments of the present disclosure, the base substrate 10 includes: a silicon CMOS chip 101; and a via hole layer 102 disposed on the silicon CMOS chip 101 and having a via hole 1022. The silicon CMOS chip 101 is connected to the plurality of pixel electrodes 21 through the via hole 1022 of the via hole layer 102. Alternatively, the base substrate 10 may include: a substrate, and a drive circuit disposed on the substrate and including a thin film transistor. The drive circuit is connected to the plurality of pixel electrodes 21. For example, the silicon CMOS chip 101 may include a silicon substrate, and a drive circuit formed on the silicon substrate.

Referring to FIG. 1 and FIG. 2, according to embodiments of the present disclosure, an overlap between the conductive layer 30 and the first one 21A of the two adjacent pixel electrodes 21A and 21B and an overlap between the conductive layer 30 and the second one 21B of the two adjacent pixel electrodes 21A and 21B have the same area, and a distance between the conductive layer 30 and the first one 21A of the two adjacent pixel electrodes 21A and 21B and a distance between the conductive layer 30 and the second one 21B of the two adjacent pixel electrodes 21A and 21B are the same.

Referring to FIG. 1 and FIG. 2, according to embodiments of the present disclosure, an orthogonal projection of each of the plurality of pixel electrodes 21 on a plane in which the plurality of pixel electrodes 21 are located has a rectangular shape, and an orthogonal projection of the conductive layer 30 on the plane has a rectangular shape.

Referring to FIG. 1 and FIG. 2, according to embodiments of the present disclosure, the first equivalent capacitance is calculated by a formula: $C_A=\varepsilon*W_A*L_A/T_A$, where $C_A$ is the first equivalent capacitance, $\varepsilon$ is a conductivity of a dielectric (the retaining wall 41 of the pixel defining layer 40) between the conductive layer 30 and the first pixel electrode 21A, between the conductive layer 30 and the second pixel electrode 21B, and between the first pixel electrode 21A and the second pixel electrode 21B, $W_A$ is a width of the overlap between the conductive layer 30 and the first pixel electrode 21A, $L_A$ is a length of the overlap between the conductive layer 30 and the first pixel electrode 21A, and $T_A$ is the distance between the conductive layer 30 and the first pixel electrode 21A; the second equivalent capacitance is calculated by a formula: $C_B=\varepsilon*W_B*L_B/T_B$, where $C_B$ is the second equivalent capacitance, $W_B$ is a width of the overlap between the conductive layer 30 and the second pixel electrode 21B, $L_B$ is a length of the overlap between the conductive layer 30 and the second pixel electrode 21B, and $T_B$ is the distance between the conductive layer 30 and the second pixel electrode 21B; and the third equivalent capacitance is calculated by a formula: $C=\varepsilon*T_O*L/D$, where C is the third equivalent capacitance, $T_O$ is a thickness of each pixel electrode 21, D is a distance between the two adjacent pixel electrodes 21A and 21B, and L is a length of each of the first pixel electrode 21A and the second pixel electrode 21B.

Referring to FIG. 1 and FIG. 2, according to embodiments of the present disclosure, an overlap between the conductive layer 30 and the first one 21A of the two adjacent pixel electrodes 21A and 21B and an overlap between the conductive layer 30 and the second one 21B of the two adjacent pixel electrodes 21A and 21B have the same length and the same width, and a distance between the conductive layer 30 and the first one 21A of the two adjacent pixel electrodes 21A and 21B and a distance between the conductive layer 30 and the second one 21B of the two adjacent pixel electrodes 21A and 21B are the same. The plurality of pixel electrodes 21 and the conductive layer 30 may have the same length.

FIG. 1 is a schematic diagram showing a structure of an array substrate for a display apparatus according to an embodiment of the present disclosure; and FIG. 2 is a schematic perspective view of the array substrate shown in FIG. 1 in which only the conductive layer 30 and the pixel electrodes 21 are retained. In other words, FIG. 1 is a sectional view of the array substrate which is taken along the line AA in FIG. 2. The display apparatus according to the embodiments of the present disclosure may be an OLED display apparatus. According to embodiments of the present disclosure, referring to FIG. 1 and FIG. 2, the array substrate 100 for the OLED display apparatus includes: a base substrate 10; a plurality of pixel units 20 which are arranged in an array on the base substrate 10; a pixel defining layer 40 configured to separate the plurality of pixel units 20; and a packaging layer 70. The pixel unit 20 includes: a pixel electrode 21, an organic light-emitting layer 50, and a common electrode 60. The pixel electrodes 21 of different pixel units 20 are separated from one another, and the common electrode may be an integrated electrode. The pixel units are controlled by means of signals transmitted through the pixel electrodes 21. A distance between two adjacent pixel electrodes 21A and 21B is small so that a parasitic capacitance or an equivalent capacitance C is formed between the two adjacent pixel electrodes 21A and 21B. When a signal is inputted to the pixel electrode 21A of the pixel unit 20A, a corresponding signal will also be probably generated in the pixel electrode 21B of the pixel unit 20B due to a capacitance coupling effect, thereby resulting in signal crosstalk. In the embodiments of the present disclosure, a conductive layer 30 is disposed above or below two adjacent pixel electrodes 21A and 21B. When a preset electric potential is applied to the conductive layer 30, a first equivalent capacitance is formed between the conductive layer 30 and the pixel electrode 21A and a second equivalent capacitance is formed between the conductive layer 30 and the pixel electrode 21B, to counteract the capacitance coupling effect between the pixel electrodes 21, thereby alleviating signal crosstalk.

In FIG. 1, the pixel electrodes 21 below the organic light-emitting layer 50 are anodes, while the common electrode 60 above the organic light-emitting layer 50 is a cathode. However, in the case of an inverted OLED, the pixel electrodes 21 below the organic light-emitting layer 50 are cathodes, while the common electrode 60 above the organic light-emitting layer 50 is an anode.

According to embodiments of the present disclosure, the conductive layer 30 is disposed above or below the two adjacent pixel electrodes 21A and 21B of the array substrate 100, so that the first equivalent capacitance $C_A$ is formed between the conductive layer 30 and the pixel electrode 21A and the second equivalent capacitance $C_B$ is formed between the conductive layer 30 and the pixel electrode 21B. Further, in order that the two equivalent capacitances have corresponding functions, a preset constant electric potential needs to be applied to the conductive layer 30. In this way, the two equivalent capacitances $C_A$ and $C_B$ and the third equivalent capacitance C formed between the two adjacent pixel electrodes 21A and 21B can alleviate the signal crosstalk. In other words, a total equivalent capacitance formed between the two adjacent pixel electrodes 21A and 21B is greatly reduced, thereby alleviating the capacitance coupling effect between the two adjacent pixel electrodes 21A and 21B and thus the signal crosstalk.

Referring to FIG. 1 and FIG. 2, according to embodiments of the present disclosure, the conductive layer 30 is disposed above or below the two adjacent pixel electrodes 21A and 21B of the array substrate 100, so that the equivalent capacitance is formed between the conductive layer 30 and the pixel electrode 21A and the equivalent capacitance is formed between the conductive layer 30 and the pixel electrode 21B. In other words, the two equivalent capacitances $C_A$ and $C_B$ are formed between the two adjacent pixel electrodes 21A and 21B and the conductive layer disposed above or below the two adjacent pixel electrodes 21A and 21B, and are connected in parallel with the original equivalent capacitance C formed between the two adjacent pixel electrodes 21A and 21B. As a result, the total equivalent capacitance can be reduced, thereby alleviating the capacitance coupling effect and thus the signal crosstalk. Further, in order that the equivalent capacitances $C_A$, $C_B$ and C connected in parallel can alleviate the capacitance coupling effect, a stable electric potential needs to be applied to the conductive layer 30. In this way, the capacitance coupling effect is minimized by adjusting values of the equivalent capacitances $C_A$ and $C_B$. In other words, signal crosstalk is reduced as far as possible, so that displaying effect of the display apparatus is improved.

Figure 6:
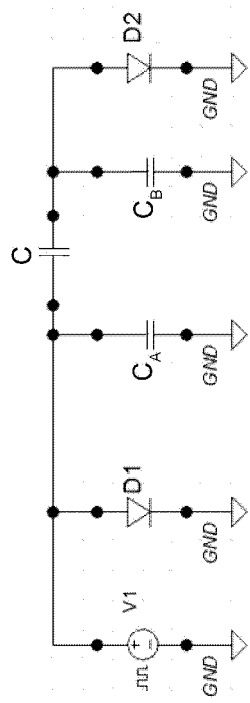
FIG. 6 is a circuit diagram corresponding to equivalent capacitances in an array substrate having a conductive layer, according to an embodiment of the present disclosure.

In some embodiments of the present disclosure, the first equivalent capacitance $C_A$, the second equivalent capacitance $C_B$, and a third equivalent capacitance C formed between the two adjacent pixel electrodes 21A and 21B are set to be the same. FIG. 6 is a circuit diagram corresponding to equivalent capacitances in the array substrate according to the embodiment of the present disclosure. If the three equivalent capacitances are the same, the total equivalent capacitance formed between the two adjacent pixel electrodes 21A and 21B is minimal. In other words, the crosstalk is minimized.

In an embodiment of the present disclosure, the first equivalent capacitance $C_A$ is calculated by a formula: $C_A=\varepsilon*W*L/T_A$, where $C_A$ is the first equivalent capacitance, $\varepsilon$ is a conductivity of the pixel defining layer 40, W is a width of the overlap between the conductive layer and the pixel electrode 21 as shown in FIG. 2, L is a length of the overlap between the conductive layer and the pixel electrode 21, and $T_A$ is the distance between the conductive layer 30 and the first pixel electrode 21A;

the second equivalent capacitance $C_B$ is calculated by a formula: $C_B=\varepsilon*W*L/T_B$, where $C_B$ is the second equivalent capacitance, and $T_B$ is the distance between the conductive layer 30 and the second pixel electrode 21B; and the third equivalent capacitance C is calculated by a formula: $C=\varepsilon*T_O*L/D$, where C is the third equivalent capacitance, $T_O$ is a thickness of each pixel electrode 21, and D is a distance between the two adjacent pixel electrodes 21A and 21B.

If the first equivalent capacitance, the second equivalent capacitance, and the third equivalent capacitance are set to be the same, the following formula for designing the conductive layer based on the equivalent capacitance can be derived: $W=T_A*T_O/D$ or $W=T_B*T_O/D$. In other words, when the conductive layer is provided, corresponding sizes are set to satisfy the above formula. In this way, the three equivalent capacitances are the same and a design for alleviating the crosstalk is optimal. Generally, $T_A$ is equal to $T_B$. Of course, based on other considerations or requirements, the three equivalent capacitances may be adjusted to achieve a desired effect. For example, a display having a resolution of 3000 PPI is taken as an example, $T_A=T_B=100$ nm, $T_O=100$ nm, and D=820 nm. It can be calculated according to the above formula that W is 12.2 nm.

In some embodiments of the present disclosure, the conductive layer 30 is made of a low-reflectivity conductive material. For example, the low-reflectivity conductive material includes Mo, Ti or Cu. Other metal wirings are also probably disposed in the array substrate 100. The metal wirings will reflect light through a pixel electrode separating region between the two adjacent pixel electrodes 21A and 21B so that a contrast of the display apparatus is reduced. The conductive layer is made of a low-reflectivity material to reduce the light that is reflected through the pixel electrode separating region by the metal wirings located below the pixel electrodes 21, thereby improving the displaying effect of the display apparatus.

In some embodiments of the present disclosure, the conductive layer 30 and the plurality of pixel electrodes 21 are insulated from each other by an inorganic film serving as the retaining wall 41. For example, the inorganic film is made of silicon oxide or silicon nitride. Alternatively, the conductive layer and the plurality of pixel electrodes 21 are insulated from each other by an organic film serving as the retaining wall 41.

FIG. 3 is a schematic diagram of pixels according to an embodiment of the present disclosure. Generally, a high-resolution display, such as a silicon-based micro-OLED display, has a resolution greater than 3000 PPI. In this embodiment, an XGA (Extended Graphics Array) display having a size of 0.39 inch and a resolution of 3256PPI is taken as an example. A distance between pixel electrodes 21 of pixel units 20 of the display is 0.85 μm. The distance between the two adjacent pixel electrodes 21A and 21B is small so that crosstalk will occur due to a parasitic capacitance, i.e. a third equivalent capacitance formed between the two adjacent pixel electrodes 21A and 21B. For example, when only the pixel unit 20A is turned on to emit light, the pixel unit 20B should be completely turned off to emit no light. However, the pixel unit 20B will emit light by coupling through the parasitic capacitance, thereby resulting in the crosstalk.

Figure 5:
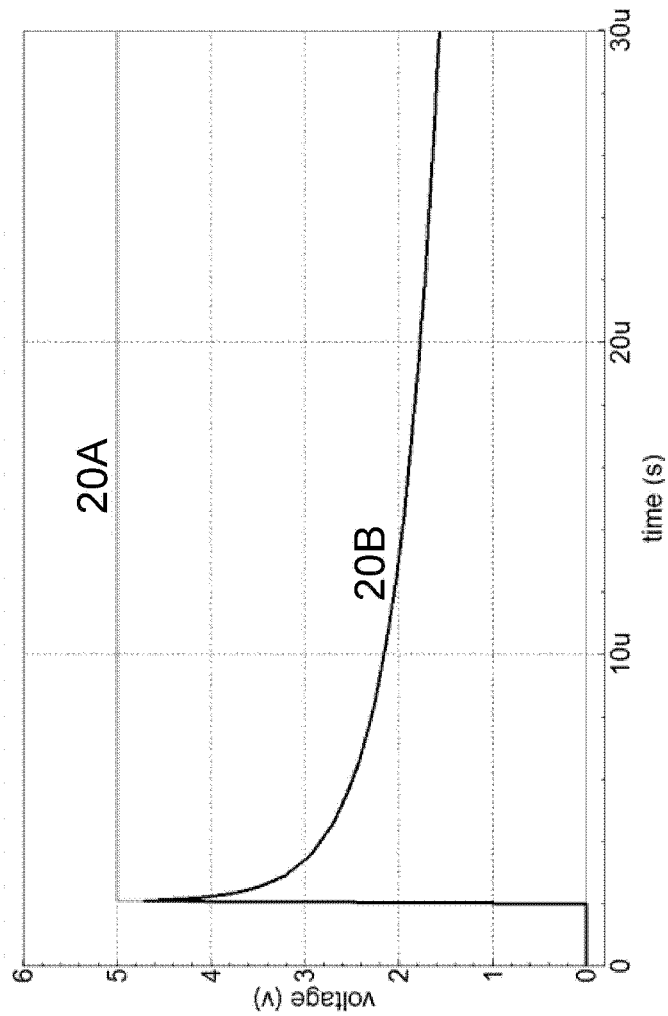
FIG. 5 is a schematic diagram showing a crosstalk simulation result of the array substrate having no conductive layer, according to the embodiment of the present disclosure.
Figure 4:
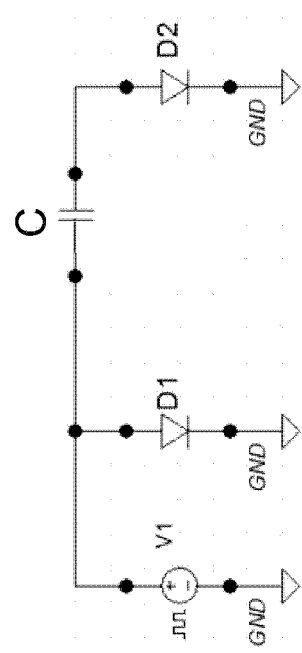
FIG. 4 is a circuit diagram corresponding to equivalent capacitances in an array substrate having no conductive layer, according to an embodiment of the present disclosure.
Figure 7:
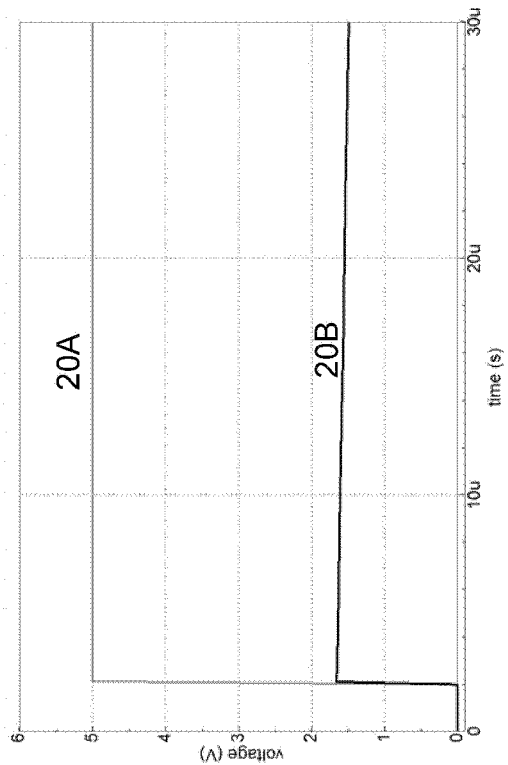
FIG. 7 is a schematic diagram showing a crosstalk simulation result of the array substrate having the conductive layer, according to the embodiment of the present disclosure.

FIG. 4 is a circuit diagram corresponding to equivalent capacitances in an array substrate having no conductive layer, according to an embodiment of the present disclosure, FIG. 5 is a schematic diagram of a crosstalk simulation result of the array substrate having no conductive layer, FIG. 6 is a circuit diagram corresponding to equivalent capacitances in an array substrate having the conductive layer, according to an embodiment of the present disclosure; and FIG. 7 is a schematic diagram of a crosstalk simulation result of the array substrate having the conductive layer. In FIG. 4 to FIG. 7, V1 denotes a signal source, D1 denotes an organic light-emitting diode of the pixel unit 20A, and D2 denotes an organic light-emitting diode of the pixel unit 20B. It can be known from FIG. 7 that if $C=C_A=C_B$, a voltage applied to the pixel electrode 21B of the pixel unit 20B by coupling is remarkably less than 2V. In other words, the voltage is less than a turn-on voltage of the OLED. In this way, crosstalk will be greatly alleviated.

Embodiments of the present disclosure further provide a display apparatus including the array substrate 100 according to any one of the above embodiments.

The display apparatus may include any products or parts having a display function such as a liquid crystal panel, an electronic paper, an OLED (organic light-emitting diode) panel, a mobile phone, a tablet computer, a TV, a display, a notebook computer, a digital frame, and a navigator.

The display apparatus has the same advantageous effects as the array substrate according to above embodiments since the display apparatus has the array substrate according to above embodiments.

In addition, although the present disclosure is described by taking the OLED array substrate as an example in the above embodiments, the array substrate according to the embodiments of the present disclosure may be an array substrate of the liquid crystal display panel or apparatus, or an array substrate of any other appropriate display apparatus.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. An array substrate comprising:
a plurality of pixel units which are arranged in an array, and which comprise a plurality of pixel electrodes arranged at intervals, respectively, wherein a third equivalent capacitance is formed between two adjacent ones of the plurality of pixel electrodes;
a conductive layer disposed above or below the two adjacent pixel electrodes, and configured such that when a preset electric potential is applied to the conductive layer, a first equivalent capacitance is formed between the conductive layer and a first one of the two adjacent pixel electrodes and a second equivalent capacitance is formed between the conductive layer and a second one of the two adjacent pixel electrodes, so that a total equivalent capacitance formed between the two adjacent pixel electrodes is less than the third equivalent capacitance;
wherein:
an orthogonal projection of each of the plurality of pixel electrodes on a plane in which the plurality of pixel electrodes are located has a rectangular shape, and an orthogonal projection of the conductive layer on the plane has a rectangular shape,
the first equivalent capacitance is calculated by a formula: $C_A=\varepsilon*W_A*L_A/T_A$, where $C_A$ is the first equivalent capacitance, $\varepsilon$ is a conductivity of a dielectric between the conductive layer and the first pixel electrode, between the conductive layer and the second pixel electrode, and between the first pixel electrode and the second pixel electrode, $W_A$ is a width of an overlap between the conductive layer and the first pixel electrode, $L_A$ is a length of the overlap between the conductive layer and the first pixel electrode, and $T_A$ is a distance between the conductive layer and the first pixel electrode;
the second equivalent capacitance is calculated by a formula: $C_B=\varepsilon*W_B*L_B/T_B$, where $C_B$ is the second equivalent capacitance, $W_B$ is a width of an overlap between the conductive layer and the second pixel electrode, $L_B$ is a length of the overlap between the conductive layer and the second pixel electrode, and $T_B$ is a distance between the conductive layer and the second pixel electrode; and
the third equivalent capacitance is calculated by a formula: $C=\varepsilon*T_O*L/D$, where C is the third equivalent capacitance, $T_O$ is a thickness of each pixel electrode, D is a distance between the two adjacent pixel electrodes, and L is a length of each of the first pixel electrode and the second pixel electrode.

2. The array substrate of claim 1, wherein:
the first equivalent capacitance, the second equivalent capacitance, and the third equivalent capacitance are set to be the same.

3. The array substrate of claim 1, wherein:
an orthogonal projection of each of the two adjacent pixel electrodes on a plane in which the plurality of pixel electrodes are located coincides partially with an orthogonal projection of the conductive layer on the plane.

4. The array substrate of claim 1, wherein:
the conductive layer is disposed above or below a pixel electrode separating region between the two adjacent pixel electrodes.

5. An array substrate comprising:
a plurality of pixel units which are arranged in an array, and which comprise a plurality of pixel electrodes arranged at intervals, respectively;
a conductive layer disposed above or below two adjacent ones of the plurality of pixel electrodes, and configured such that when a preset electric potential is applied to the conductive layer, a first equivalent capacitance is formed between the conductive layer and a first one of the two adjacent pixel electrodes and a second equivalent capacitance is formed between the conductive layer and a second one of the two adjacent pixel electrodes, wherein:
each of the plurality of pixel electrodes comprises two opposite edge portions, and a middle portion between the two edge portions; and
the array substrate further comprises:
a base substrate on which the plurality of pixel electrodes are disposed; and
a pixel defining layer comprises a retaining wall, wherein the retaining wall is located both on an exposed portion, in a pixel electrode separating region between the two adjacent pixel electrodes, of the base substrate, and on the edge portions, close to the exposed portion, of the two adjacent pixel electrodes, and the conductive layer is disposed on the retaining wall.

6. The array substrate of claim 5, further comprising:
an organic light-emitting layer covering the middle portions of the pixel electrodes.

7. The array substrate of claim 5, further comprising:
an organic light-emitting layer covering both the middle portions of the pixel electrodes and the conductive layer.

8. The array substrate of claim 7, further comprising:
a common electrode covering the organic light-emitting layer.

9. The array substrate of claim 5, wherein:
the base substrate comprises: a silicon CMOS chip; and a via hole layer disposed on the silicon CMOS chip and having a via hole, wherein the silicon CMOS chip is connected to the plurality of pixel electrodes through the via hole of the via hole layer.

10. The array substrate of claim 1, wherein:
an overlap between the conductive layer and the first one of the two adjacent pixel electrodes and an overlap between the conductive layer and the second one of the two adjacent pixel electrodes have a same area, and a distance between the conductive layer and the first one of the two adjacent pixel electrodes and a distance between the conductive layer and the second one of the two adjacent pixel electrodes are the same.

11. The array substrate of claim 1, wherein:
an overlap between the conductive layer and the first one of the two adjacent pixel electrodes and an overlap between the conductive layer and the second one of the two adjacent pixel electrodes have a same length and a same width, and a distance between the conductive layer and the first one of the two adjacent pixel electrodes and a distance between the conductive layer and the second one of the two adjacent pixel electrodes are the same.

12. The array substrate of claim 11, wherein:
the plurality of pixel electrodes and the conductive layer have a same length.

13. The array substrate of claim 1, wherein:
the conductive layer is made of a conductive material.

14. The array substrate of claim 13, wherein:
the conductive material comprises Mo, Ti or Cu.

15. The array substrate of claim 1, further comprising:
an inorganic film disposed between the conductive layer and the plurality of pixel electrodes to insulate the conductive layer from the plurality of pixel electrodes.

16. The array substrate of claim 15, wherein:
the inorganic film is made of silicon oxide or silicon nitride.

17. The array substrate of claim 1, further comprising:
an organic film disposed between the conductive layer and the plurality of pixel electrodes to insulate the conductive layer from the plurality of pixel electrodes.

18. A display apparatus comprising: the array substrate of claim 1.

* * * * *